United States Patent
Im et al.

(10) Patent No.: US 9,542,264 B2
(45) Date of Patent: Jan. 10, 2017

(54) MEMORY SYSTEM MONITORING DATA INTEGRITY AND RELATED METHOD OF OPERATION

(71) Applicant: SAMSUNG ELECTRONICS CO., LTD., Suwon-Si, Gyeonggi-Do (KR)

(72) Inventors: Kwangseok Im, Seoul (KR); Jung-Yeon Yoon, Hwaseong-si (KR); Han-Ju Lee, Hwaseong-si (KR); Ha-Neul Jeong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 120 days.

(21) Appl. No.: 14/541,303

(22) Filed: Nov. 14, 2014

(65) Prior Publication Data

US 2015/0135042 A1    May 14, 2015

(30) Foreign Application Priority Data

Nov. 14, 2013 (KR) .................. 10-2013-0138418

(51) Int. Cl.
*G11C 29/00* (2006.01)
*G06F 11/10* (2006.01)
*H03M 13/09* (2006.01)

(52) U.S. Cl.
CPC ....... *G06F 11/1004* (2013.01); *G06F 11/1008* (2013.01); *G06F 11/1076* (2013.01); *H03M 13/09* (2013.01)

(58) Field of Classification Search
CPC .. H03M 13/091; H03M 13/09; G06F 11/1004; G06F 11/10
See application file for complete search history.

(56) References Cited

U.S. PATENT DOCUMENTS

| | | | |
|---|---|---|---|
| 7,411,959 B2* | 8/2008 | Elzur | H04L 12/2856 370/394 |
| 7,562,284 B2 | 7/2009 | Benhase et al. | |
| 7,574,554 B2 | 8/2009 | Tanaka et al. | |
| 7,934,052 B2 | 4/2011 | Prins et al. | |
| 8,069,317 B2 | 11/2011 | Boyd et al. | |
| 8,112,602 B2 | 2/2012 | Li et al. | |
| 8,190,832 B2* | 5/2012 | Dickey | G06F 3/061 711/156 |
| 8,234,445 B2 | 7/2012 | Chou et al. | |
| 8,495,469 B2 | 7/2013 | Bakke et al. | |
| 8,527,724 B2 | 9/2013 | Banzhaf et al. | |

(Continued)

*Primary Examiner* — Esaw Abraham
(74) *Attorney, Agent, or Firm* — Volentine & Whitt, PLLC

(57) ABSTRACT

A memory controller comprises at least one interface configured to receive a request, user data, and an address from an external source, a first data check engine configured to generate data check information based on the received address and the user data in response to the received request, and a second data check engine configured to check the integrity of the user data based on the generated data check information where the user data is transmitted to the nonvolatile memory. The memory controller is configured to transmit the user data received from the external source to an external destination where the integrity of the user data is verified according to a check result, and is further configured to transmit an interrupt signal to the external source and the external destination where the check result indicates that the user data comprises an error.

10 Claims, 13 Drawing Sheets

(56) References Cited

U.S. PATENT DOCUMENTS

| | | | |
|---|---|---|---|
| 8,694,857 B2* | 4/2014 | Wang | G06F 11/10 |
| | | | 714/763 |
| 8,762,609 B1* | 6/2014 | Lam | G06F 15/8007 |
| | | | 710/22 |
| 9,021,183 B2* | 4/2015 | Matsuyama | G06F 11/10 |
| | | | 711/103 |
| 9,043,549 B2* | 5/2015 | Chiang | G06F 12/0866 |
| | | | 711/115 |
| 9,081,662 B2* | 7/2015 | Teo | G06F 12/0246 |
| 2010/0312960 A1 | 12/2010 | Bert | |
| 2011/0289280 A1 | 11/2011 | Koseki et al. | |
| 2012/0096329 A1 | 4/2012 | Taranta, II | |
| 2012/0311381 A1 | 12/2012 | Porterfield | |

* cited by examiner

MEMORY SYSTEM MONITORING DATA INTEGRITY AND RELATED METHOD OF OPERATION

CROSS-REFERENCE TO RELATED APPLICATIONS

This application claims priority under 35 USC §119 to Korean Patent Application No. 10-2013-0138418 filed on Nov. 14, 2013, the subject matter of which is hereby incorporated by reference.

BACKGROUND OF THE INVENTION

The inventive concept relates generally to electronic memory technologies, and more particularly to nonvolatile memory systems that monitor data integrity.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include read only memory (ROM), magnetoresistive random access memory (MRAM), resistive random access memory (RRAM), and flash memory.

A typical memory system operates under the control of a memory controller. The memory controller receives information (e.g., data, requests, etc.) from an external device (e.g., host, application processor, etc.) and controls a memory device based on the received information. Unfortunately, the information may be corrupted during transmission or reception. Accordingly, a data integrity field (DIF) may be provided with the information in order to allow detection of the corruption.

In a conventional nonvolatile memory device, the DIF is stored in a page, together with user data. The presence of the DIF, however, restricts the amount of user data that can be stored in the same page. Accordingly, there is a general need for techniques and technologies that reduce the amount of space occupied by a DIF within a nonvolatile memory device.

SUMMARY OF THE INVENTION

In one embodiment of the inventive concept, a nonvolatile memory system comprises a nonvolatile memory comprising a plurality of pages, a buffer memory configured to temporarily store user data received from an external device, and a memory controller configured to write the user data into the nonvolatile memory or transmit read data to the external device according to a request from the external device. The memory controller comprises a host interface configured to receive the user data from the external device and to store the user data received from the external device in the buffer memory, a memory interface configured to receive the user data stored in the buffer memory and transmit the user data received from the buffer memory to the nonvolatile memory, a first data check engine configured to generate write data check information based on the user data received by the host interface, and a second data check engine configured to check integrity of the user data to be transmitted to the nonvolatile memory via the memory interface based on the generated write data check information. The memory controller is configured to transmit the user data to be transmitted to the nonvolatile memory to the nonvolatile memory where the integrity of the user data to be transmitted to the nonvolatile memory is verified according to a check result of the second data check engine.

In another embodiment of the inventive concept, a method is provided for operating a nonvolatile memory system comprising a memory controller and a nonvolatile memory. the method comprises receiving a write request, user data, and a logical block address from an external device, generating write data check information based on the received logical block address and the user data in response to the received write request, checking the integrity of user data based on the generated write data check information where the user data is transmitted to the nonvolatile memory, transmitting the user data received from the external device to the nonvolatile memory where the integrity of the user data is verified according to a check result, and transmitting an interrupt signal to the external device where the check result indicates that the user data comprises an error.

In another embodiment of the inventive concept, a memory controller comprises at least one interface configured to receive a request, user data, and an address from an external source, a first data check engine configured to generate data check information based on the received address and the user data in response to the received request, and a second data check engine configured to check the integrity of the user data based on the generated data check information where the user data is transmitted to the nonvolatile memory. The memory controller is configured to transmit the user data received from the external source to an external destination where the integrity of the user data is verified according to a check result, and is further configured to transmit an interrupt signal to the external source and the external destination where the check result indicates that the user data comprises an error.

These and other embodiments of the inventive concept can potentially improve the efficiency of memory use by storing user data without a DIF.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In certain embodiments described below, a nonvolatile memory system generates data check information to check the integrity of data, and it verifies the integrity of user data to be transmitted to a host or a nonvolatile memory based on the generated data check information. The nonvolatile memory system does not, however, store the generated data check information in the nonvolatile memory. Accordingly, because an additional storage space for storing an integrity field is not required, available storing capacity increases relative to a conventional system. As a result, a nonvolatile memory system with improved reliability and reduced cost may be provided.

Figure 1:
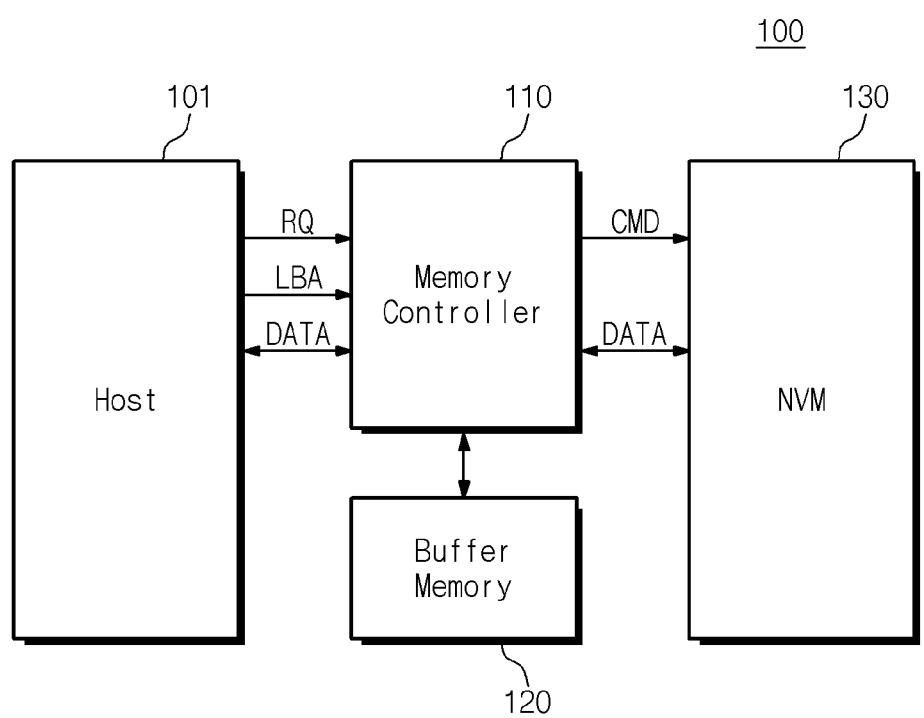
FIG. 1 is a block diagram of a system according to an embodiment of the inventive concept.

FIG. 1 is a block diagram of a system 100 according to an embodiment of the inventive concept. System 100 may comprise, for instance, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game machine, a navigation system, a black box, a digital camera, a digital multimedia broadcasting (DMB) player, a digital audio recorder, a digital audio player, a digital picture recorder, a digital picture player, a digital video recorder, or a digital video player.

Referring to FIG. 1, system 100 comprises a host 101, a memory controller 110, a buffer memory 120, and a nonvolatile memory 130. Memory controller 110, buffer memory 120, and nonvolatile memory 130 may each be provided in combination with a single semiconductor chip, a single semiconductor module or a single semiconductor device. Alternatively, memory controller 110, buffer memory 120, and nonvolatile memory 130 may be implemented as part of a single chip, module or device. Memory controller 110 and nonvolatile memory 130 may be disposed outside of host 101 or embedded in host 101. The inventive concept, however, is not limited to these alternatives.

Host 101 exchanges data with memory controller 110, e.g., using a standardized interface protocol such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a mobile industrial process interface (MIPI) protocol, Nonvolatile Memory-express (NVMe) protocol or universal flash storage (UFS) protocol.

Host 101 transmits a request RQ and a logical block address LBA for reading data stored in nonvolatile memory 130 or writing data into nonvolatile memory 130 to memory controller 110. Host 101 exchanges data DATA with memory controller 110. Logical block address LBA may be an address indicating a unit defined by an operating system of host 101.

Memory controller 110 reads data stored in nonvolatile memory 130 or writes data into nonvolatile memory 130 in response to signals received from host 101. Buffer memory 120 temporarily stores data DATA received from host 101 or nonvolatile memory 130. Buffer memory 120 temporarily stores data to be transmitted to host 101 and data to be transmitted to nonvolatile memory 130.

Nonvolatile memory 130 operates under the control of memory controller 110 and may be used as a storage medium of system 100. Nonvolatile memory 130 may be one of a NAND flash memory, a NOR flash memory, a PRAM, an MRAM, a ReRAM, and a PRAM, for example. Nonvolatile memory 130 may comprise a plurality of blocks each comprising a plurality of pages. Each of the pages may comprise a user area to store user data and a spare area to store meta data. the spare area may comprise a logical page number corresponding to the user data stored in the user area.

Memory controller 110 generates data check information DC based on data DATA and logical block address LBA received from host 101. Data check information DC is used to check the integrity of the data to be transmitted to nonvolatile memory 130 or host 101. It may comprise, for instance, a cyclical redundancy check (CRC) code generated based on the data received from host 101 or nonvolatile memory 130. It may also comprise a logical block address LBA.

Memory controller 110 checks the integrity of data to be transmitted to nonvolatile memory 130 and data to be transmitted to host 101 based on the generated data check information DC. For example, memory controller 110 may check the integrity of the data to be transmitted to nonvolatile memory 130 and the data to be transmitted to host 101, based on a CRC algorithm such as CRC-16 and CRC-32, using the CRC or parity code in data check information DC.

Where the integrity of the data to be stored in nonvolatile memory 130 is confirmed, memory controller 110 transmits the data to be stored in nonvolatile memory 130 to nonvolatile memory 130. In this case, memory controller 110 may transmit data, without data check information DC, to nonvolatile memory 130.

Where the integrity of the data to be transmitted to host 101 is confirmed, memory controller 110 transmits the data to host 101. In this case, memory controller 110 may transmit data without data check information DC, to host 101.

Where an error is detected in the data to be transmitted to nonvolatile memory 130 and the data to be transmitted to host 101, memory controller 110 may transmit an interrupt signal to nonvolatile memory 130 and host 101. Nonvolatile memory 130 and host 101 receiving the interrupt signal may perform a predetermined operation.

Figure 2:
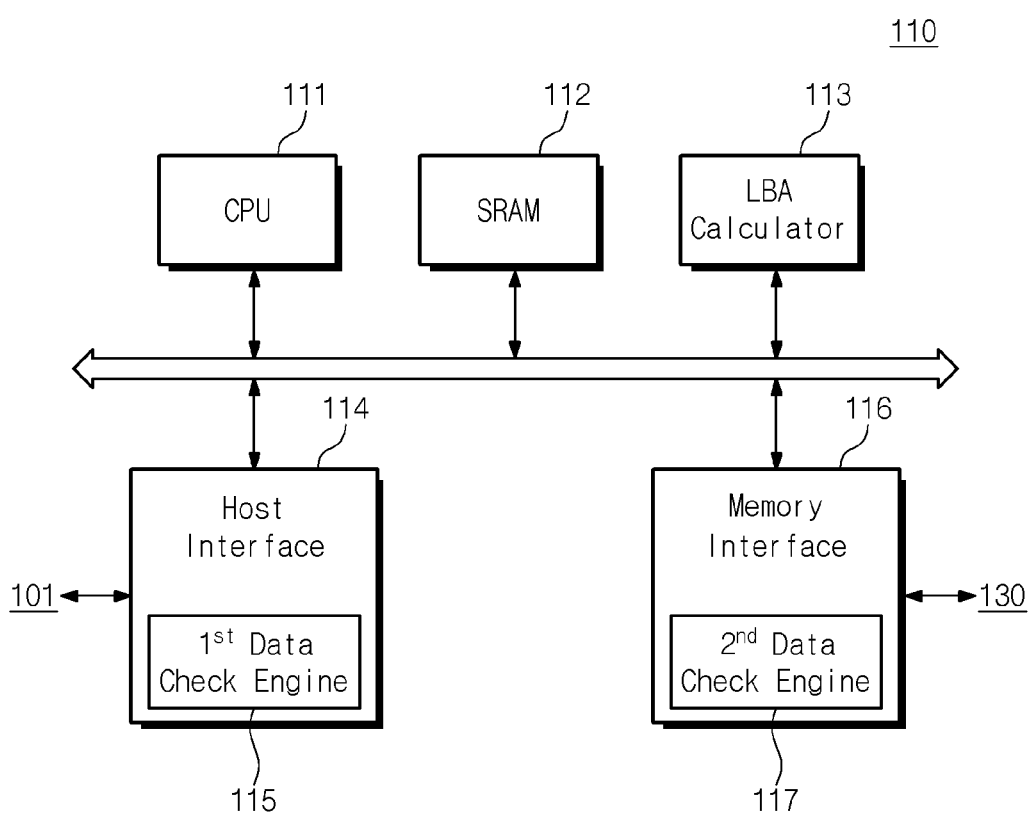
FIG. 2 is a detailed block diagram of memory controller in the system of FIG. 1 according to an embodiment of the inventive concept.

FIG. 2 is a block diagram of memory controller 110 according to an embodiment of the inventive concept.

Referring to FIGS. 1 and 2, memory controller 110 comprises a CPU 111, an SRAM 112, an LBA calculator 113, a host interface 114, and a memory interface 116.

CPU 111 controls the overall operation of memory controller 110. SRAM 112 may be a cache memory, a temporary memory, a main memory, or a buffer memory of CPU 111.

LBA calculator 113 calculates a logical block address LBA based on a logical page number LPN stored in nonvolatile memory 130. For example, logical block address LBA may be managed based on a unit defined by host 101. Logical page number LPN may be managed based on a unit defined by nonvolatile memory 130. Memory controller 110 may manage a mapping relationship between logical block address LBA and logical page number LPN to sequentially map logical block addresses LBA to logical page number LPN. LBA calculator 113 may calculate logical block address LBA, based on the mapping relationship, using logical page number LPN.

Host interface 114 supports communication between host 101 and memory controller 110. Host interface 114 comprises a first data check engine 115, which generates data check information DC based on the data and logic block address LBA received from host 101.

Memory interface 116 supports communication between memory controller 110 and nonvolatile memory 130. Memory interface 116 may comprise a second data check engine 117. Second data check engine 117 generate data check information DC based on the data and logical block address LBA received from nonvolatile memory 130.

In some embodiments, first data check engine 115 checks the integrity of data to be transmitted to host 101 based on data check information DC generated by second data check engine 117. Second data check engine 127 checks the integrity of data to be transmitted to nonvolatile memory 130 based on data check information DC generated by first data check engine 115.

In some embodiments, first and second data check engines 125 and 127 are disposed outside host interface 124 and memory interface 126, respectively. First and second data check engines 125 and 127 may be configured in the form of hardware or software.

In some embodiments, memory controller 110 checks the integrity of the data to be transmitted to memory controller 110 or the data to be transmitted to nonvolatile memory 130. In this case, data check information DC is not written into nonvolatile memory 130 and thus the entire capacity of a user area in a page may be used to store data. In addition, because data bandwidth of host 101 increases, a nonvolatile memory system with improved performance and increased capacity is provided.

Figure 3:
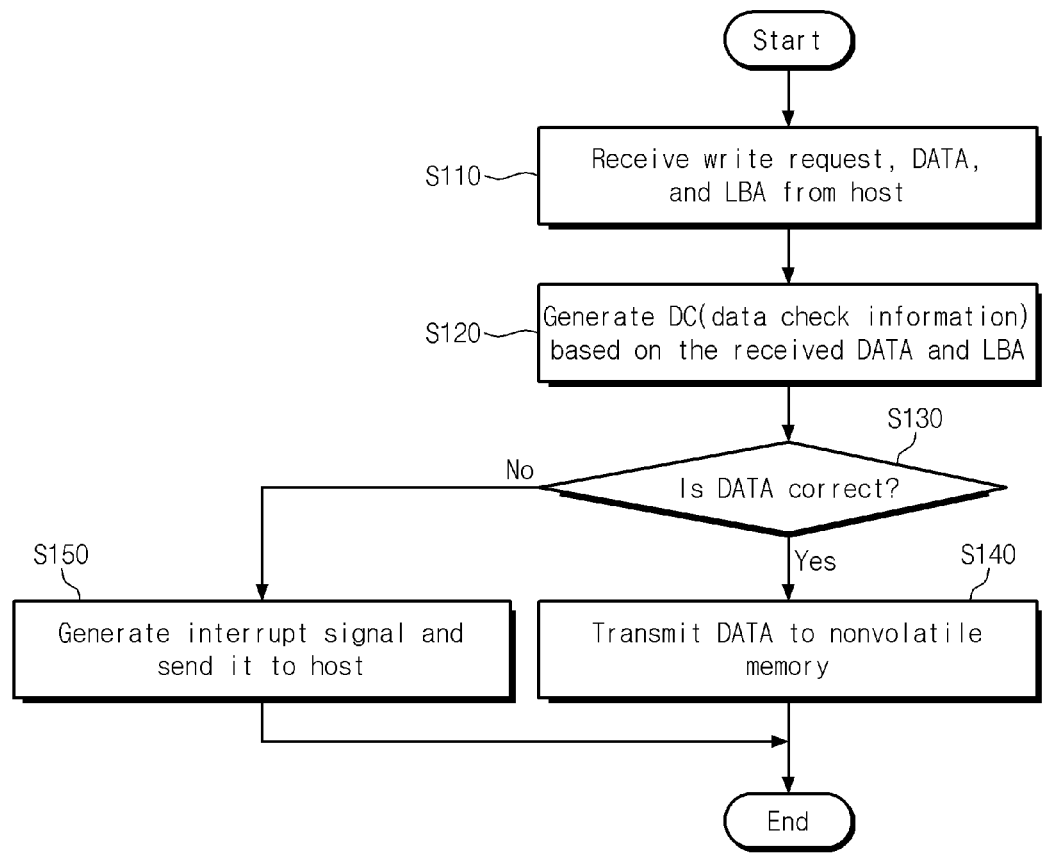
FIG. 3 is a flowchart illustrating the operation of a memory controller in the system of FIG. 1 according to an embodiment of the inventive concept.

FIG. 3 is a flowchart illustrating the operation of memory controller 110 in FIG. 1 according to an embodiment of the inventive concept. A write operation of memory controller 110 will be described with reference to FIG. 3.

Referring to FIGS. 1 to 3, in a step S110, memory controller 110 receives a write request RQ, user data DATA, and a logical block address LBA from host 101. The received user data DATA may be stored in buffer memory 120. Logical block address LBA may be an address of user data DATA defined by an operating system of host 101.

In a step S120, memory controller 110 generates data check information DC based on the received logical block address LAB and user data DATA. For example, memory controller 110 may generate a CRC code based on the received user data DATA. Memory controller 110 generates data check information DC based on the generated CRC code and logical block address LBA. The generated data check information DC may be stored in buffer memory 120.

In a step S130, memory controller 110 checks the integrity of user data DATA to be transmitted to nonvolatile memory 130. For example, user data DATA to be transmitted to nonvolatile memory 130 may be user data DATA stored in buffer memory 120. User data DATA stored in buffer memory 120 may be transmitted to memory interface 116 to be transmitted to nonvolatile memory 130. Second data check engine 117 checks the integrity of user data DATA to be transmitted to nonvolatile memory 130, based on an error detection algorithm such as CRC-16 and CRC-32, using the generated data check information DC.

In a step S140, if the data integrity is verified according to a checking result, memory controller 110 transmits user data DATA to nonvolatile memory 130. Nonvolatile memory 130 may write the received user data DATA into a user area of a corresponding page and write a corresponding logical page number LPN into a spare area.

In a step S150, if the checking result is that an error is in data, memory controller 110 transmits an interrupt signal to host 101. Host 101 may then retransmit user data DATA in response to the received interrupt signal. Alternatively, host 101 may perform a predetermined operation in response to the received interrupt signal.

Figure 4:
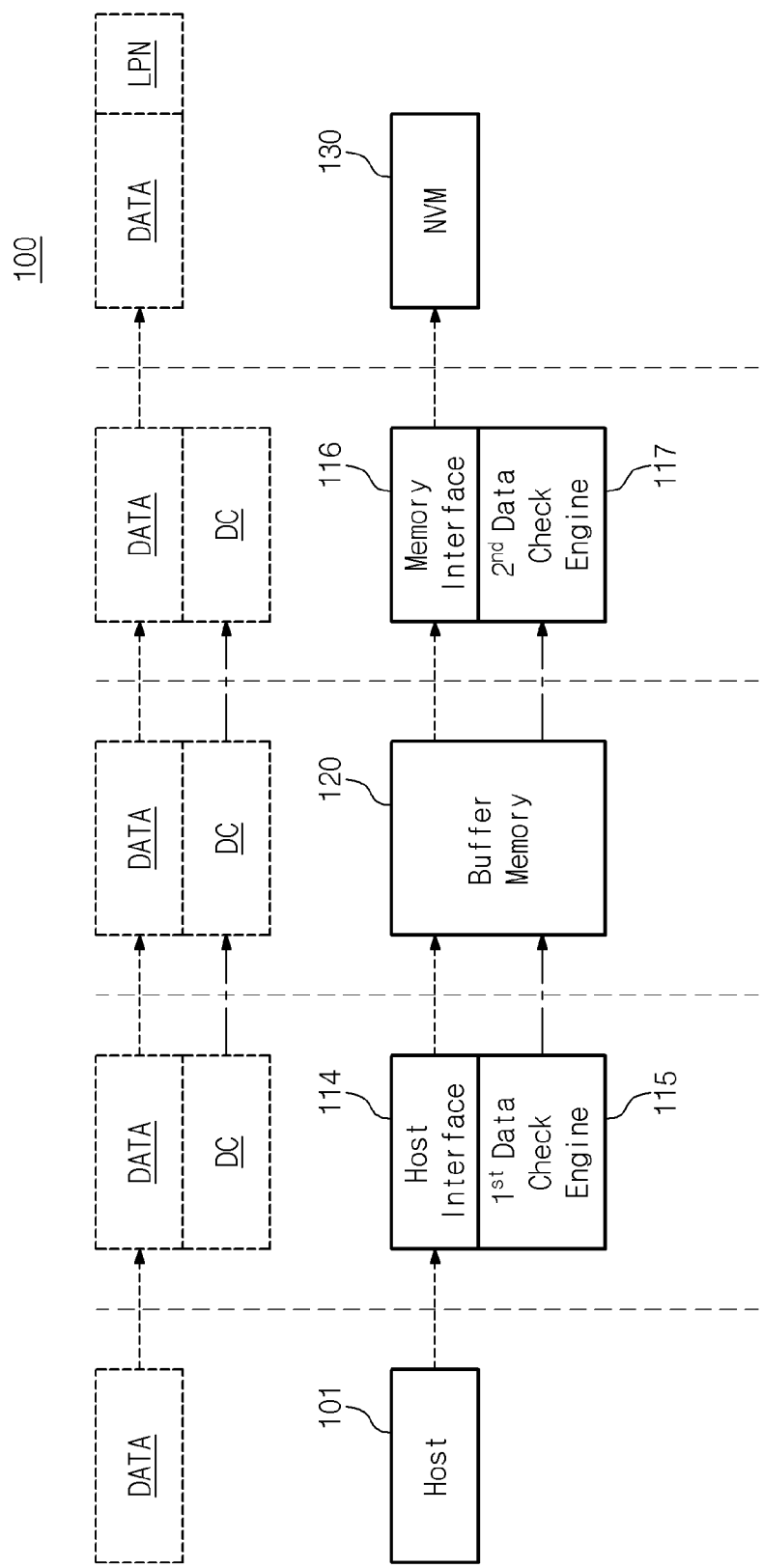
FIG. 4 is a block diagram illustrating a write method in FIG. 3 according to an embodiment of the inventive concept.

FIG. 4 is a block diagram illustrating a write method in FIG. 3 according to an embodiment of the inventive concept. Flows of user data DATA and user check information DC will be described with reference to FIG. 4. The flow of user data DATA is indicated by a dotted line and the flow of data check information DC is indicated by a dashed line. For ease of description, components unnecessary for explaining the write operation of memory controller 110 will be omitted.

Referring to FIG. 4, user data DATA received from host 101 may be stored in buffer memory 120 via host interface 114. At this time, first data check engine 115 in host interface 114 may generate data check information DC based on user data DATA received from host 101. For example, first data check engine 115 may generate a CRC code based on the received user data DATA. First data check engine 115 may generate data check information DC based on the generated CRC code and logical block address LBA received from host 101. The generated data check information DC may be stored in buffer memory 120.

User data DATA stored in buffer memory 120 may be transmitted to nonvolatile memory 130 via memory interface 116. At this time, second data check engine 117 in memory interface 116 may verify the integrity of user data DATA to be transmitted to nonvolatile memory 130, based on data check information DC stored in buffer memory 120. For example, second data check engine 117 may verify the integrity of user data DATA to be transmitted to nonvolatile memory 130 based on the CRC code in data check information DC. When the integrity of user data DATA to be transmitted to nonvolatile memory 130 is achieved, memory controller 110 transmits user data DATA to nonvolatile memory 130. if an error is in user data DATA to be transmitted to nonvolatile memory 130, memory controller 110 may transmit an interrupt signal to host 101.

In some embodiments, data check information DC is not transmitted to nonvolatile memory 130. That is, user data DATA may be stored in a user area of nonvolatile memory 130 and a corresponding logical page number LPN may be stored in a spare area of nonvolatile memory 130. Thus, because an area for storing data check information DC is not required, a nonvolatile memory system with reduced cost and increased capacity is provided.

Figure 5:
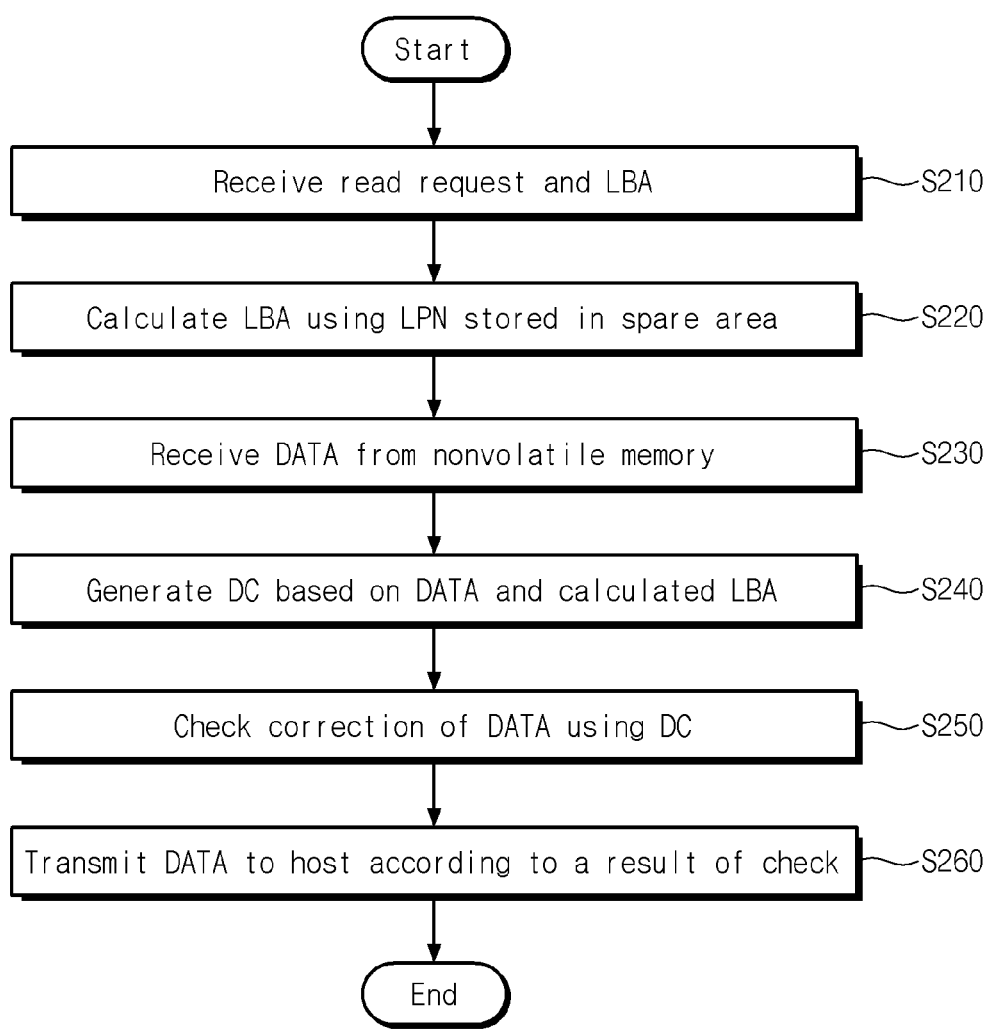
FIG. 5 is a flowchart illustrating the operation of a memory controller in the system of FIG. 1 according to an embodiment of the inventive concept.

FIG. 5 is a flowchart illustrating the operation of memory controller 110 in FIG. 1 according to an embodiment of the inventive concept. A read operation of memory controller 110 will be described with reference to FIG. 5.

Referring to FIGS. 2 and 5, in a step S210, memory controller 110 receives a read request RQ and a logical block address LBA from host 101. In a step S220, memory controller 110 calculates logical block address LBA based on logical page number LPN stored in the spare area of nonvolatile memory 130. For example, memory controller 110 may comprise an LBA calculator 113. LBA calculator 113 calculates logical block address LBA based on a corresponding relationship between logical page number LPN and logical block address LBA of data.

For example, logical block address LBA may be an address corresponding to a sector unit defined by an operating system of host 101. logical page number LPN may be a component corresponding to a page of nonvolatile memory 130. A plurality of sectors may be stored in a single page. Memory controller 110 calculates logical block address LBA from logical page number LPN using the corresponding relationship between logical block address LBA and logical page number LPN.

In a step S230, memory controller 110 receives user data DATA from nonvolatile memory 130. User data DATA may be data corresponding to logical block address LBA received from host 101. The received user data DATA is stored in buffer memory 120. User data DATA stored in buffer memory 120 may be user data to be transmitted to host 101.

In a step S240, memory controller 110 generates data check information DC based on the received user data DATA and the calculated logical block address LBA. The generated data check information DC is then stored in buffer memory 120.

In a step S250, memory controller 110 checks the integrity of user data DATA to be transmitted to host 101, based on the generated data check information. For example, first data check engine 115 may check the integrity of user data DATA to be transmitted to host 101, based on an error detection algorithm such as CRC-16, CRC-32, etc., using data check information DC stored in buffer memory 120. In addition, first data check engine 115 may compare logical block address LBA in data check information DC with a logical address received from host 101.

In a step S260, memory controller 110 transmits user data DATA according to a checking result. For example, if the integrity of user data DATA to be transmitted to host 101 is achieved (i.e., user data DATA does not comprise an error, and a logical block address in data check information DC and a received logical block address match each other), memory controller 110 may transmit user data DATA to host 101. Tf user data DATA to be transmitted to host 101 comprises an error, memory controller 110 may transmit an interrupt signal. host 101 or nonvolatile memory 130 receiving the interrupt signal may perform a predetermined operation.

Figure 6:
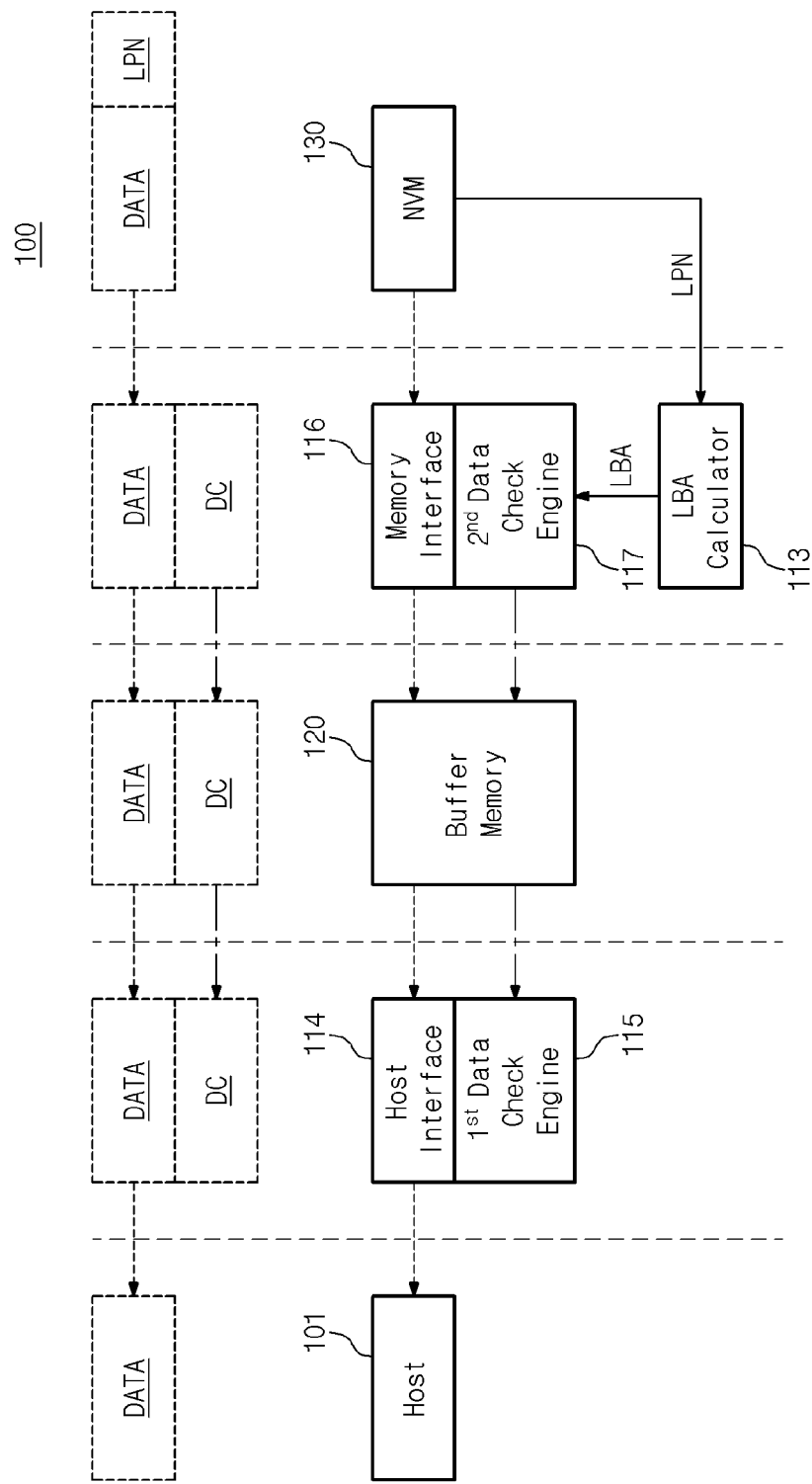
FIG. 6 is a diagram for describing a read operation method in FIG. 5 according to an embodiment of the inventive concept.

FIG. 6 is a diagram for describing a read operation method in FIG. 5 according to an embodiment of the inventive concept. Flows of user data DATA and data check information DC will be described with reference to FIG. 6. In FIG. 6, the flow of user data DATA is indicated by a dotted line and the flow of data check information DC is indicated by a dashed line. For ease of description, components unnecessary for explaining the read operation of memory controller 110 will be omitted.

Referring to FIGS. 2 and 6, user data DATA stored in nonvolatile memory 130 is stored in buffer memory 120 via memory interface 116. At this time, LBA calculator 113 may calculate a logical block address LBA based on a logical page number LPN corresponding to a page in which user data DATA is stored.

Second data check engine 117 generates data check information DC based on the calculated logical block address LBA and user data DATA received from nonvolatile memory 130. For example, second data check engine 117 may generate a CRC code based on user data DATA received from nonvolatile memory 130. Second data check engine 117 may generate data check information DC based on the generated CRC code and the calculated logical block address LBA. The generated data check information DC may be stored in buffer memory 120.

User data DATA stored in buffer memory 120 is transmitted to host 101 via host interface 114. At this time, first data check engine 115 may check the integrity of user data DATA to be transmitted to host 101, based on data check information DC stored in buffer memory 120. For example, first data check engine 115 checks the integrity of the user data to be transmitted to host 101 using data check information DC. First data check engine 115 may compare logical block address LBA in data check information DC with the logical block address received from host 101. In other words, first data check engine 115 may check the integrity of the user data to be transmitted to host 101 and the integrity of logical block address LBA. Memory controller 110 transmits user data DATA, without data check information DC, to host 101.

As indicated by the foregoing, in certain embodiments of the inventive concept, memory controller 110 checks the integrity of user data to be transmitted to nonvolatile memory 130 or the integrity of user data to be transmitted to host 101 by using data check information DC. In addition, when user data DATA is transmitted to host 101 or nonvolatile memory 130, memory controller 110 may not transmit data check information DC. Because data check information DC is not stored in nonvolatile memory 130, the entire capacity of a user area of nonvolatile memory 130 may be used to store user data. Accordingly, because a management unit of user data managed by host 101 increases, data transmission bandwidth of host 101 may increase. Thus, improved performance may be achieved. In addition, because the entire capacity of the user area of nonvolatile memory 130 is used to store the user data, a nonvolatile memory with increased capacity and reduced cost may be provided.

Figure 7:
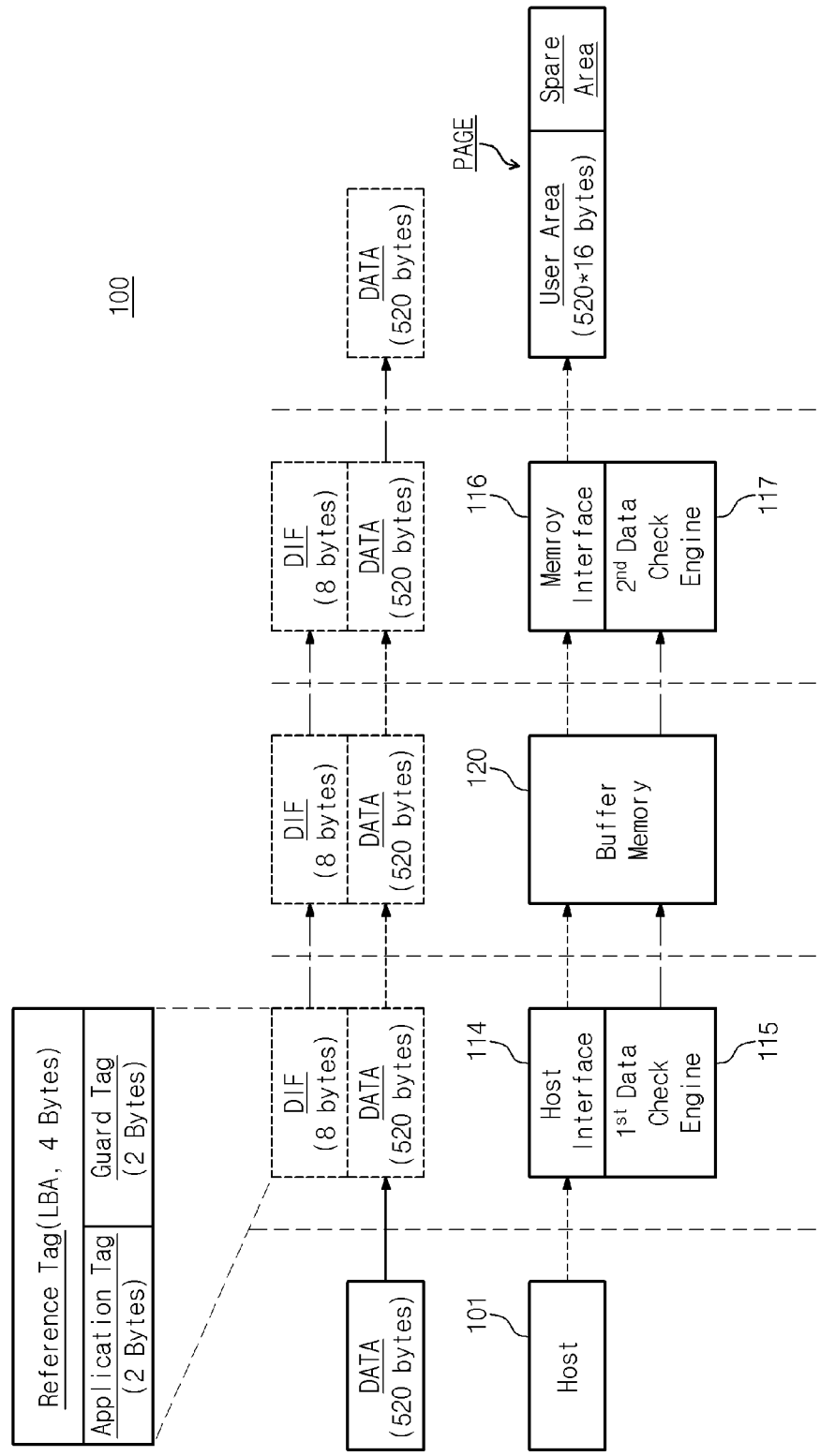
FIG. 7 is a diagram illustrating an example of data check information according to an embodiment of the inventive concept.

FIG. 7 is a diagram illustrating an example of data check information according to an embodiment of the inventive concept. This example is a DIF. In FIG. 7, a flow of user data DATA is indicated by a dotted line and a flow of the DIF is indicated by a dashed line.

Referring to FIGS. 1, 2, and 7, nonvolatile memory 130 comprises a plurality of pages each comprising a user area to store user data DATA and a spare area to store meta data such as ECC and LPN. The user area may be implemented to have capacity of 520*16 bytes. That is, user data of 520*16 bytes may be stored in a single page. For ease of description, only one of the pages is shown in FIG. 7.

Memory controller 110 receives user data DATA from host 101. For example, user data DATA received from host 101 may be stored in buffer memory 120 via host interface 114. User data DATA may have a storage unit defined by an operating system of host 101. User data DATA may have a size of 520 bytes.

Where user data DATA is transmitted to nonvolatile memory 130, a DIF is used to check the integrity of user data DATA. The DIF is generated by a host bus adaptor (HBA) of host 101 or memory controller 110, and it comprises a reference tag comprising a logical block address LBA, a guard tag comprising a CRC code, and an application tag. The reference tag comprises lower 32 bits of logical block address LBA and has a size of 4 bytes. The guard tag comprises a CRC code of 2 bytes. The application tag may be configured by an application layer (e.g., operating system) of host 101 and has a size of 2 bytes. the DIF requires storage capacity of 8 bytes.

When a user area of a single page has a size of 520*16 bytes, host 101 must manage user data in units of 512 bytes to assure the integrity of the user data using the DIF. However, first data check engine 115 may generate a DIF. Second data check engine 117 may check the integrity of user data to be transmitted to nonvolatile memory 130 based on the generated DIF. At this time, the DIF may not be stored in nonvolatile memory 130. Accordingly, in this embodiment, the integrity of user data DATA may be preserved without storing the DIF in nonvolatile memory 130. Therefore, write and read operations of user data DATA having a unit of 520 bytes may be supported.

For example, during the write operation of the user data, memory controller 110 may generate a guard tag (i.e., a CRC code of user data) based on the received user data DATA. Thereafter, user data DATA is transmitted to nonvolatile memory 130 via a memory interface 116. At this time, second data check engine 117 checks the integrity of user data DATA to be transmitted to nonvolatile memory 130, based on the generated guard tag. Thereafter, user data DATA is stored in the user area of nonvolatile memory 130. the user area may have storage capacity of 520 bytes. A size of user data DATA may be 520 bytes. That is, because the DIF is not stored in nonvolatile memory 130, the entire user area may be used as a storage space of user data DATA.

According to the above-described embodiment, a nonvolatile memory comprises a plurality of pages each comprising a user data to store user data and a spare area to store meta data. The user area may have storage capacity of 520*16 bytes. During a write operation, a memory controller receives user data of 520 bytes and generates a DIF to check the integrity of the received user data. Thereafter, the user data of 520 bytes is stored in the user area of the nonvolatile memory. At this time, the DIF may not be stored in nonvolatile memory device.

Although not shown, memory controller 110 may perform a read operation based on the same method as shown in FIG. 6. For example, during a read operation, memory controller 110 may calculate a logical block address LBA based on a logical page number LPN stored in a spare area to generate a DIF. memory controller 110 may check the integrity of user data to be transmitted to a host by using the generated DIF. Thereafter, DIF-free user data of 520 bytes may be transmitted to the host. Thus, a nonvolatile memory system according to an embodiment of the inventive concept may satisfy DIF specification to check the integrity of the user data and may support read and write operations of 520 bytes data.

Figure 8:
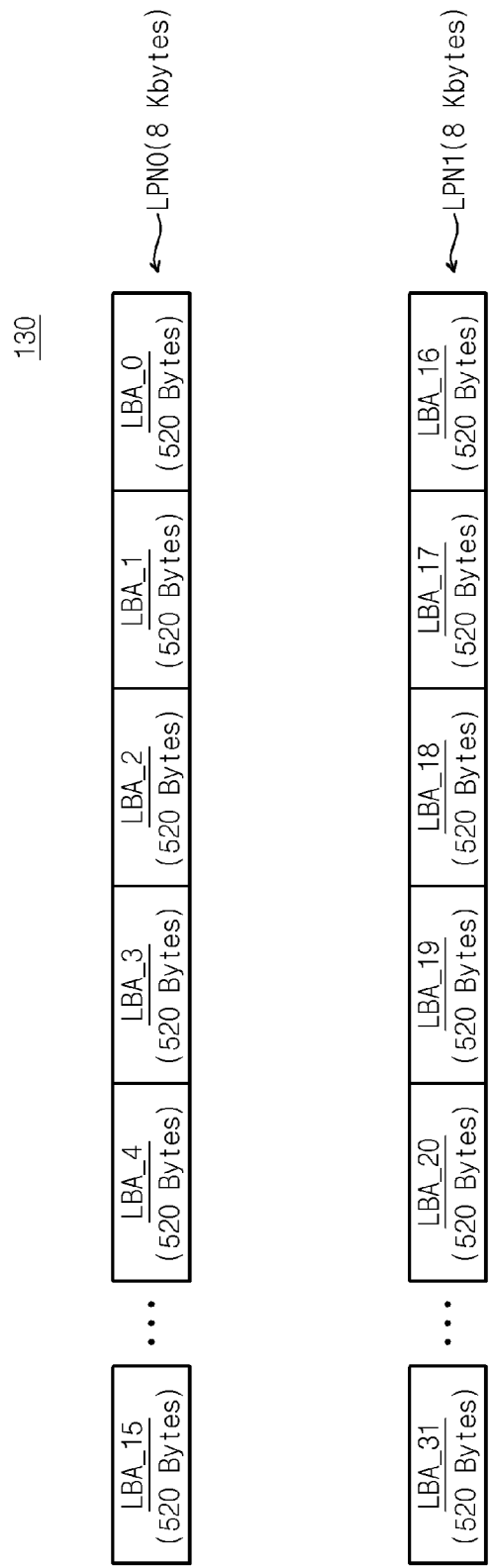
FIG. 8 is a diagram illustrating an relationship between a logical block address of user data and a logical page number of a nonvolatile memory according to an embodiment of the inventive concept.

FIG. 8 is a diagram illustrating an relationship between a logical block address of user data and a logical page number of a nonvolatile memory.

Referring to FIGS. 1 and 8, host 101 may manage user data in units of sectors. A single page may comprise a plurality of sectors. For example, a logical block address LBA may be an address corresponding to a single sector defined by an operating system of host 101. The single page may store data of a plurality of sectors. In other words, a single logical page number LPN may correspond to a plurality of logical block addresses LBA. Logical block addresses LBA may sequentially correspond to logical block number LPN.

For example, a first page LPN0 may comprise a user area having a size of 520*16 bytes (8 Kbytes). Each of first to sixteenth sectors LBA0~LBA15 may be 520 bytes. That is, the first to sixteenth sectors LBA0~LBA15 may be in first page LPN0. Seventeenth to thirty second sectors LBA16~LBA31 may be in a second page LPN1. That is, logical block addresses LBA are mapped to logical page number LPN such that they increase sequentially. That is, a size of a user area of a single page may be integer times of a size of a single sector. LBA calculator 113 may calculate a logical block address LBA of user data, based on the above mapping method.

Figure 9:
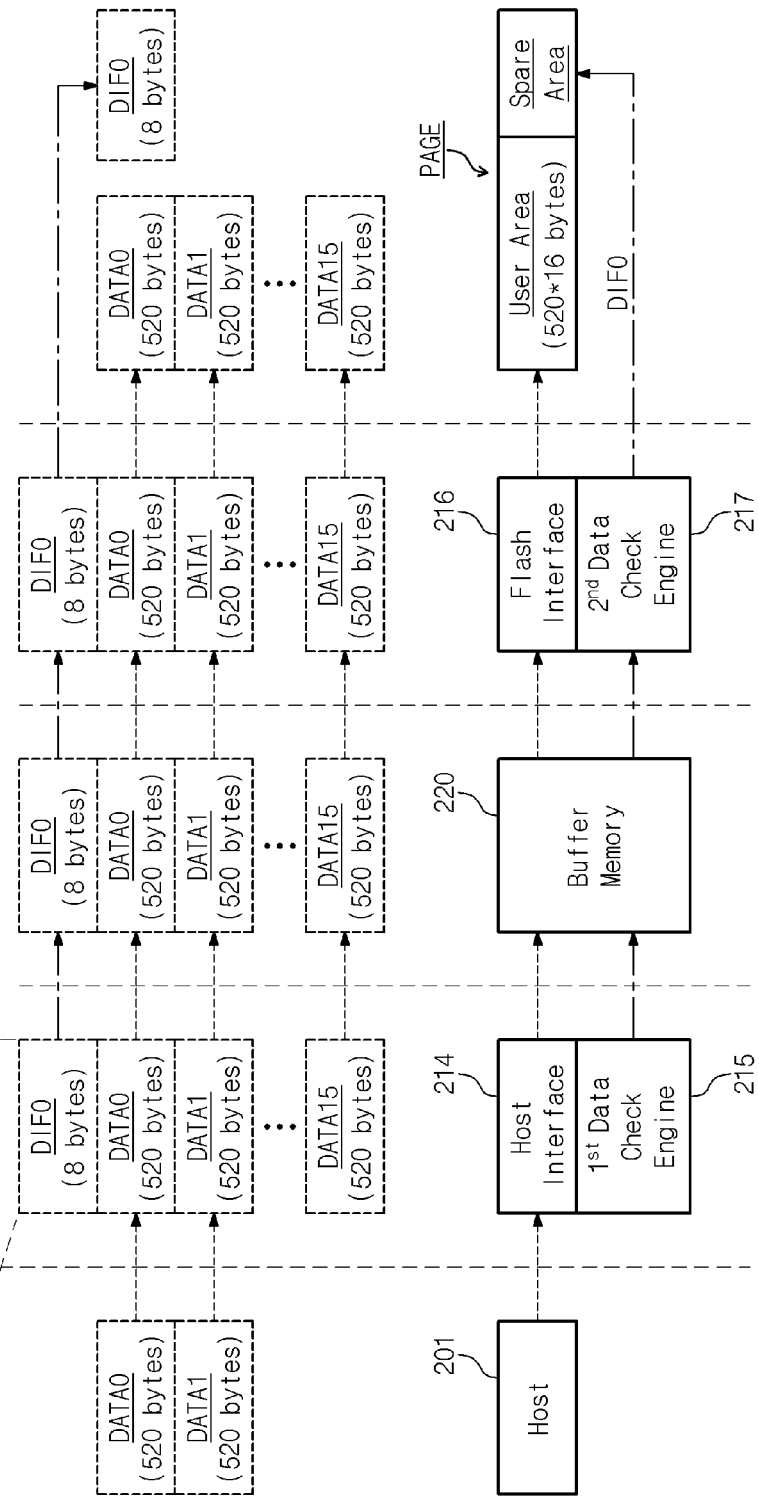
FIG. 9 is a diagram illustrating application example of data check information according to an embodiment of the inventive concept.

FIG. 9 is a diagram illustrating application example of data check information according to an embodiment of the inventive concept. Another example of a DIF will be described with reference to FIG. 9. In FIG. 9, a flow of user data DATA is indicated by a dotted line and a flow of the DIF is indicated by a dashed line.

Referring to FIGS. 8 and 9, memory controller 110 receives user data DATA0~DATA15 through a host interface 214. The received user data DATA0~DATA15 may be stored in buffer memory 220.

Nonvolatile memory 230 comprises a plurality of pages each comprising a user area and a spare area. The user area of the single page may comprise a plurality of sectors. As shown in FIG. 8, a plurality of logical block addresses may be configured to sequentially increase in the single page.

In the example in FIG. 9, unlike the example in FIG. 7, a DIF of first user data DATA0 may be stored in a spare area. First user data DATA0 may be a start sector (e.g., LBA0 or LAB16 in FIG. 8) of a user area. That is, DIF0 may comprise information of the start logical block address LBA0. In this case, a logical block address LBA may be calculated with respect to a plurality of sectors in a single page, based on the start logical block address LBA0. For example, logical block addresses LBA shown in FIG. 8 may sequentially increase in a single page. That is, a logical block address LBA corresponding to user data may be calculated by sequentially increasing start logical block addresses LBA0.

In the example of FIGS. 7 and 9, memory controller 110 may support the specification of T10 DIF. Table (1) shows support items depending on types of T10 DIF.

TABLE (1)

| DIF type | Guard Tag | Application Tag | Reference Tag | Protection |
|---|---|---|---|---|
| Type0 | X | X | X | X |
| Type1 | ○ (CRC) | X | ○ (LBA) | ○ |
| Type2 | ○ (CRC) | ○ (refer to CDB) | ○ (refer to CDB) | ○ |

Referring to Table (1), Type2 of T10 DIF generates an application tag and a reference tag with reference to a command descriptor block (CDB). Thus, a logical block address in the reference tag may be different from a logical block address calculated based on a logical page number stored in a spare area. Tags represented by X in the Table (1) may be expressed by data of 16'h0 or 0x4119 (ASCII "AI").

However, as shown in FIG. 9, because a plurality of logical block addresses in a single page increase sequentially when a DIF0 for a start sector in the single page is stored in a spare area, an application tag and a reference tag for the other sectors except for the start sector may be calculated. Without a need to store all DIFs for a plurality of sectors, a single DIF for the start sector is stored in a spare area to assure data integrity of the plurality of sectors. Thus, a nonvolatile memory system with improved reliability, reduced cost, and increased capacity may be provided.

Figure 10:
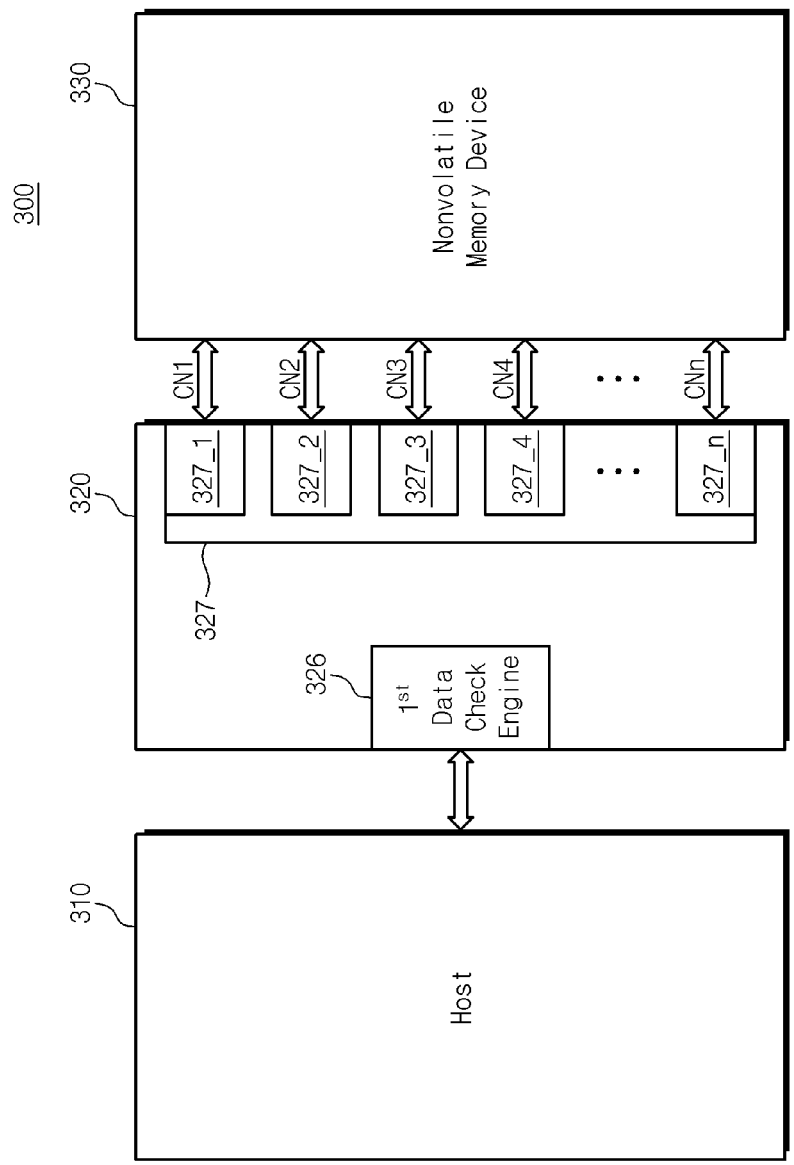
FIG. 10 is a block diagram of a system according to an embodiment of the inventive concept.

FIG. 10 is a block diagram of a system 300 according to an embodiment of the inventive concept.

Referring to FIG. 10, system 300 comprises a host 310, a memory controller 320, and a nonvolatile memory 330. Host 310, memory controller 320, and nonvolatile memory 330 are similar to features described with reference to FIG. 1 and will not be described in further detail.

Memory controller 320 and nonvolatile memory 330 in FIG. 10 communicate with each other through a plurality of channels CN1~CNn, which may be driven independently. For example, memory controller 320 may transmit user data to nonvolatile memory 330 through first and second channels CN1 and CN2. At the same time, user data stored in nonvolatile memory 330 may be transmitted to memory controller 320 through third and fourth channels CN3 and CN4.

Memory controller 320 comprises first and second data check engines 326 and 327. First data check engine 326 may operate based on a method described with reference to FIGS. 1 through 9.

Second data check engine 327 comprises a plurality of second data check engine units 327_1~327_n for the plurality of channels CN1~CNn. Each of the second data check engine units 327_1~327_n may operate based on a method described with reference to FIGS. 1 through 9. Second data check engine units 327_1~327_n may operate to correspond to channels CN1~CNn, respectively.

Although not shown, where host 310 and memory controller 320 communicate with each other through a plurality of channels, the first data check engine 326 may comprise a plurality of first data check engine units.

Figure 11:
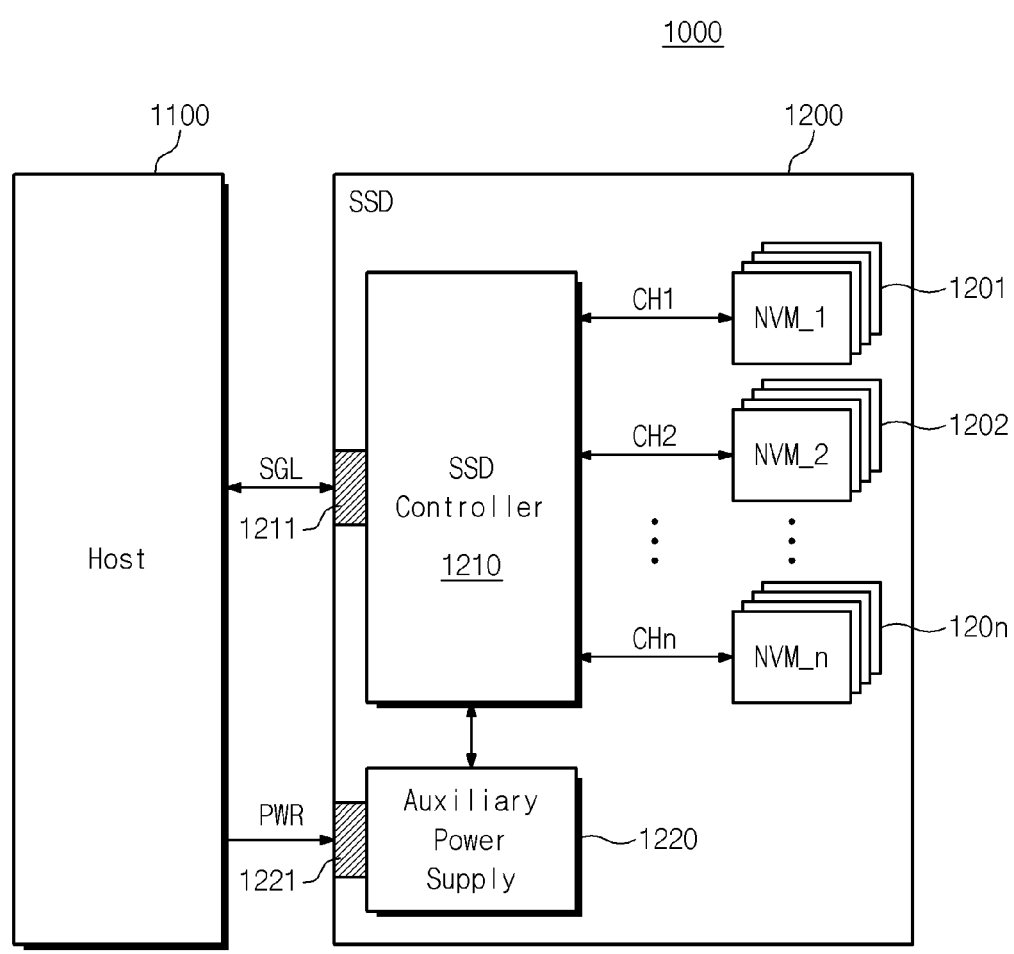
FIG. 11 is a block diagram illustrating an example of a solid state disk (SSD) system comprising a nonvolatile memory system according to an embodiment of the inventive concept.

FIG. 11 is a block diagram illustrating an SSD system 1000 comprising a nonvolatile memory system according to an embodiment of the inventive concept.

Referring to FIG. 11, SSD system 1000 comprises a host 1100 and an SSD 1200. SSD 1200 exchanges signals with host 1100 through a signal connector 2211 and receives power through a power connector 2221. SSD 1200 may comprise a plurality of flash memories 1201~120n, an SSD controller 1210, and an auxiliary power supply 1220.

Flash memories 1201~120n are used as storage media of SSD 1200. As alternatives to flash memory, SSD 1200 may employ a nonvolatile memory such as PRAM, MRAM, ReRAM, or FRAM. Flash memories 1201~120n may be connected to the SSD controller 1210 through a plurality of channels CH1~CHn. One or more flash memories may be connected to one channel. A flash memory connected to one channel may be connected to the same data bus.

SSD controller 1210 may exchange a signal SGL with the host 1100 through a signal connector 1211. Signals SGL may comprise a command, an address, data, and the like. The SSD controller 1210 may write or read out data to or from a corresponding flash memory according to a command of host 1100. SSD controller 1210 may operate based on a method described with reference to FIGS. 1 through 10.

SSD controller 1210 checks data integrity using data check information (or DIF). However, SSD controller 1210 may not store the data check information (or DIF) in flash memories 1201~120n.

Auxiliary power supply 1220 may be connected to the host 1100 through a power connector 1221. Auxiliary power supply 1220 may be charged by power PWR from host 1100. Auxiliary power supply 1220 may be disposed inside or outside the SSD 1200. For example, auxiliary power supply 1220 may be disposed on a main board to supply auxiliary power to the SSD 1200.

Figure 12:
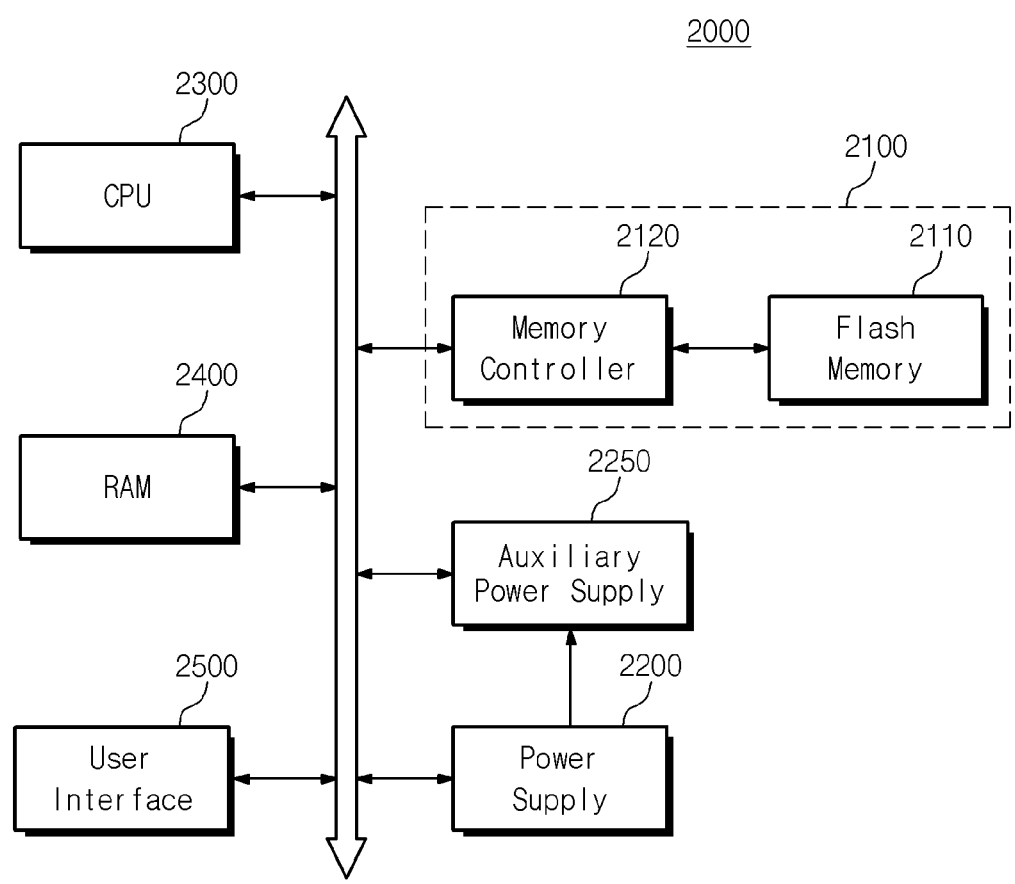
FIG. 12 is a block diagram of an electronic device comprising a nonvolatile memory system according to an embodiment of the inventive concept.

FIG. 12 is a block diagram of an electronic device 2000 comprising a nonvolatile memory system according to an embodiment of the inventive concept. Electronic device 2000 may be provided as one of computing systems such as a UMPC, a workstation, a net-book, a PDA, a portable computer, a web tablet, a wireless phone, a mobile phone, a smart phone, an e-book, a PMP, a portable game device, a navigation device, a black box, a digital camera, a DMB player, a digital audio recorder, a digital audio player, a digital picture recorder, a digital picture player, a digital video recorder, and a digital video player.

Referring to FIG. 12, electronic device 2000 comprises a memory system 2100, a power supply 2200, an auxiliary power supply 2250, a CPU 2400, a random access memory (RAM) 2400, and a user interface 2500. Memory system 2100 may be a nonvolatile memory system described with reference to FIGS. 1 through 10. Memory controller 2120 may operate based on a method described with reference to FIGS. 1 through 10.

Figure 13:
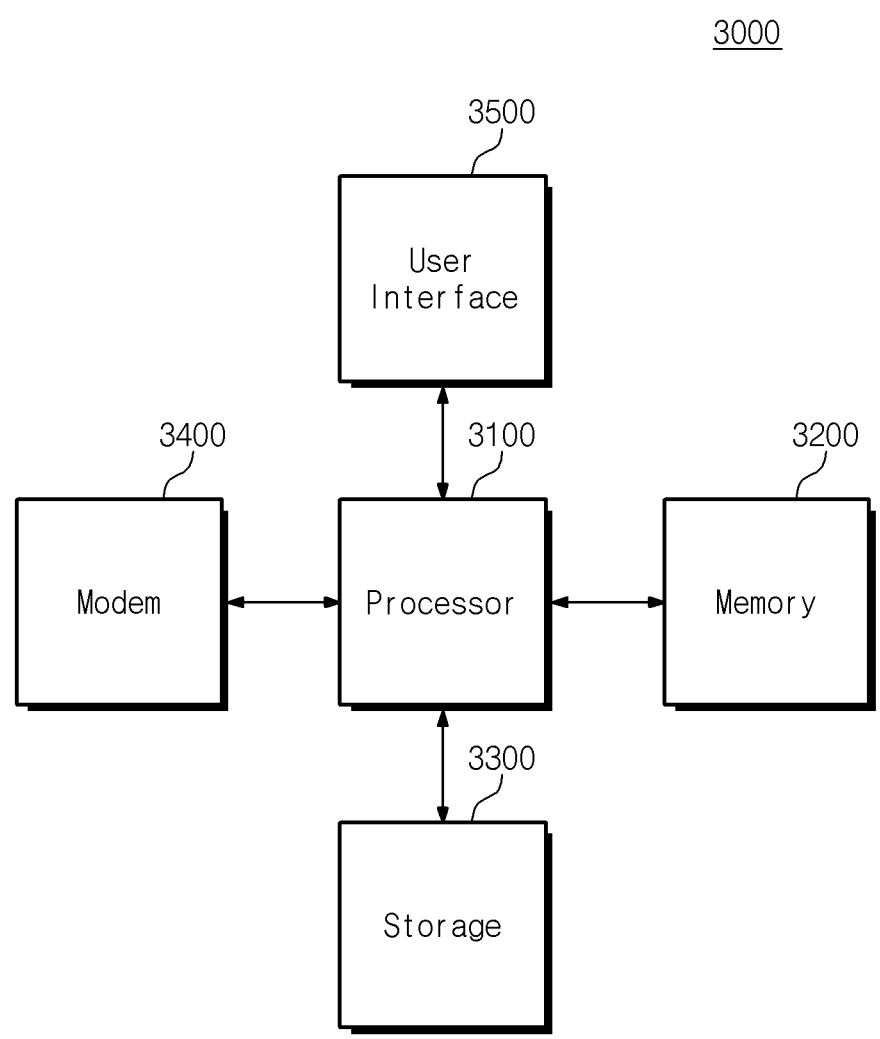
FIG. 13 is a block diagram of a mobile system comprising a nonvolatile memory system according to an embodiment of the inventive concept.

FIG. 13 is a block diagram of a mobile system 3000 comprising a nonvolatile memory system according to an embodiment of the inventive concept.

Referring to FIG. 13, mobile system 3000 comprises a processor 3100, a memory 3200, a storage 3300, a modem 3400, and a user interface 3500.

Processor 3100 controls the overall operation of mobile system 3000 and performs logical calculation. Processor 3100 may be implemented in a system-on-chip (SoC), and it may comprise, for instance, a general-purpose processor or an application processor.

Memory 3200 may communicate with process 3100. Memory 3200 may be a working memory (or main memory) of processor 3100 or mobile system 3000. Memory 3200 may comprise a volatile memory such as an SRAM, a DRAM, and an SDRAM or a nonvolatile memory such as a flash memory, a PRAM, an MRAM, an RRAM, or an FRAM, for instance.

Storage 3300 provides long-term data storage for mobile system 3000. Storage 3300 may comprise a hard disk drive (HDD) or a nonvolatile memory such as a flash memory, a PRAM, an MRAM, an RRAM, and an FRAM. Storage 3300 may be a nonvolatile memory system described with reference to FIGS. 1 to 10. Storage 3300 may check the integrity of user data, as discussed with reference FIGS. 1 through 10.

Memory 3200 and storage 3300 may comprise the same type of nonvolatile memories. In this case, memory 3200 and storage 3300 may each comprise a single semiconductor integrated circuit.

Modem 3400 may perform communication with an external device under control of processor 3100. For example, modem 3400 may perform wired or wireless communication with an external device. Modem 3400 may perform communication based on at least one of various wireless communication schemes such as long term evolution (LTE), WiMax, glocal system for mobile communication (GSM), code division multiple access (CDMA), Bluetooth, near field communication (NFC), WiFi, and radio frequency identification (RFID) or various wired communication schemes such as universal serial bus (USB), serial AT attachment (SATA), small computer small interface (SCSI), firewire, and peripheral component interconnection (PCI).

User interface 3500 may communicate with a user according to the control of processor 3100. For example, user interface 3500 may comprise user input interfaces such as a keyboard, a keypad, a button, a touch panel, a touch screen, a touch pad, a touch ball, a camera, a microphone, a gyroscope sensor, and a vibration sensor. User interface 4500 may comprise user output interfaces such as a liquid crystal display (LCD), an organic light emitting diode (OLED) display, an active matrix OLED (AMOLED) display, an LED, a speaker, and a monitor.

According to certain embodiments described above, a memory controller checks the integrity of user data to be transmitted to a host or user data to be transmitted to a nonvolatile memory, based on data check information. The data check information is not stored in a user area of the nonvolatile memory. That is, the entire capacity of a user area of the nonvolatile memory may be used to store the user data. Thus, a nonvolatile memory with increased capacity and improved performance is provided. In certain embodiments, the integrity of user data is achieved based on data check information. In addition, because data check information is not written into a nonvolatile memory, the entire user area of a page is used as a storage area to store the user data. Thus, a nonvolatile memory with increased capacity and improved reliability and an operating method of the nonvolatile memory are provided. The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A nonvolatile memory system, comprising:
a nonvolatile memory comprising a plurality of pages;
a buffer memory configured to temporarily store user data received from an external device; and
a memory controller configured to write the user data into the nonvolatile memory or transmit read data to the external device according to a request from the external device,
wherein the memory controller comprises:
a host interface configured to receive the user data from the external device and to store the user data received from the external device in the buffer memory;
a memory interface configured to receive the user data stored in the buffer memory and transmit the user data received from the buffer memory to the nonvolatile memory;
a first data check engine configured to generate write data check information based on the user data received by the host interface; and
a second data check engine configured to check integrity of the user data to be transmitted to the nonvolatile memory via the memory interface based on the generated write data check information,
wherein the memory controller is configured to transmit the user data to be transmitted to the nonvolatile memory to the nonvolatile memory where the integrity of the user data to be transmitted to the nonvolatile memory is verified according to a check result of the second data check engine.

2. The nonvolatile memory system of claim 1, wherein the write data check information comprises a logical block address of the user data and a cyclic redundancy check (CRC) code generated based on the user data.

3. The nonvolatile memory system of claim 1, wherein each of the pages comprises a user area to store the user data and a spare area to store a logical page number.

4. The nonvolatile memory system of claim 3, wherein a size of the user area is equal to a size of the user data or is an integer multiple of the size of the user data.

5. The nonvolatile memory system of in claim 3, wherein the memory controller further comprises a logical block address calculator configured to calculate a logical block address of the user data stored in the user area based on the logical page number stored in the spare area.

6. The nonvolatile memory system of claim 5, wherein the memory controller is configured to receive a read request from the external device and perform a read operation in response to the received read request,
wherein the memory interface is configured to receive the user data stored in the user area and store the received user data in the buffer memory during the read operation,
wherein the host interface is configured to receive the user data stored in the buffer memory and transmit the received user data to the external device,
wherein the second data check engine is configured to generate read data check information based on the calculated logical block address and the user data received by the memory interface, and
wherein the first check engine is configured to check the integrity of user data to be transmitted to the external device based on the read data check information where the user data is transmitted to the external device via the host interface.

7. The nonvolatile memory system of claim 5, wherein the read data check information comprises a reference tag comprising a logical block address of the user data and a guard tag comprising a cyclic redundancy check (CRC) code for detecting an error of the user data.

8. The nonvolatile memory system of claim 7, wherein the memory controller is configured to transmit the user data without the read data check information to the external device.

9. The nonvolatile memory system of claim 1, wherein the write data check information comprises a reference tag comprising a logical block address of the user data and a guard tag comprising a cyclic redundancy check (CRC) code for detecting an error of the user data.

10. The nonvolatile memory system of claim 9, wherein the memory controller is configured to transmit the user data without the read data check information to the nonvolatile memory.

* * * * *